United States Patent
Iwata et al.

(10) Patent No.: US 7,198,983 B2
(45) Date of Patent: Apr. 3, 2007

(54) SOLDER BALL EXCELLENT IN MICRO-ADHESION PREVENTING PROPERTIES AND WETTING PROPERTIES AND METHOD FOR PREVENTING THE MICRO-ADHESION OF SOLDER BALLS

(75) Inventors: Kengo Iwata, Yasugi (JP); Koji Sato, Yasugi (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 11/067,727

(22) Filed: Mar. 1, 2005

(65) Prior Publication Data

US 2005/0196949 A1 Sep. 8, 2005

(30) Foreign Application Priority Data

Mar. 8, 2004 (JP) ............................. 2004-064296
Jun. 29, 2004 (JP) ............................. 2004-190594

(51) Int. Cl.
*H01L 21/00* (2006.01)

(52) U.S. Cl. ...................... 438/108; 438/613

(58) Field of Classification Search ............... 257/737, 257/738; 438/108, 613
See application file for complete search history.

(56) References Cited

U.S. PATENT DOCUMENTS

| | | | |
|---|---|---|---|
| 5,789,068 A | 8/1998 | King et al. | |
| 6,387,499 B1 * | 5/2002 | Sohma et al. ............... | 428/403 |
| 6,416,590 B1 * | 7/2002 | Hirata et al. ............... | 148/24 |

FOREIGN PATENT DOCUMENTS

| | | |
|---|---|---|
| JP | 08-164496 A | 6/1996 |
| JP | 10-135618 A | 5/1998 |
| JP | 10-166177 A | 6/1998 |
| JP | 2000-24791 A | 1/2000 |
| JP | 2003-317682 | 11/2000 |

* cited by examiner

*Primary Examiner*—Roy Karl Potter
(74) *Attorney, Agent, or Firm*—Sughrue Mion, PLLC

(57) ABSTRACT

The present invention provides a solder ball that has solved the problem of micro-adhesion and, moreover, has solved both of the problems of micro-adhesion and wetting properties, and a method for preventing the micro-adhesion of solder balls. That is, the present invention provides a solder ball obtained by solidification and spheroidization in a gas phase and having metal soap molecules, preferably a metal soap molecules film of 3 nm or less in thickness, adsorbed on its surface. As the metal soap, there can be used, for example, calcium stearate, magnesium stearate or barium stearate. The present invention is preferably applied to solder balls with a diameter of 400 μm or less. The present invention also provides a method for preventing the micro-adhesion of solder balls which comprises immersing solder balls obtained by solidification and spheroidization in a gas phase, in a solution containing a metal soap dispersed therein, preferably, a solution containing a metal soap dispersed therein to a concentration of less than 5 ppm; taking out the solder balls from the solution; vaporizing the solvent on the surfaces of the solder balls; and then drying the surfaces. The drying is preferably conducted in an atmosphere having a relative humidity RH≦40%.

5 Claims, 1 Drawing Sheet

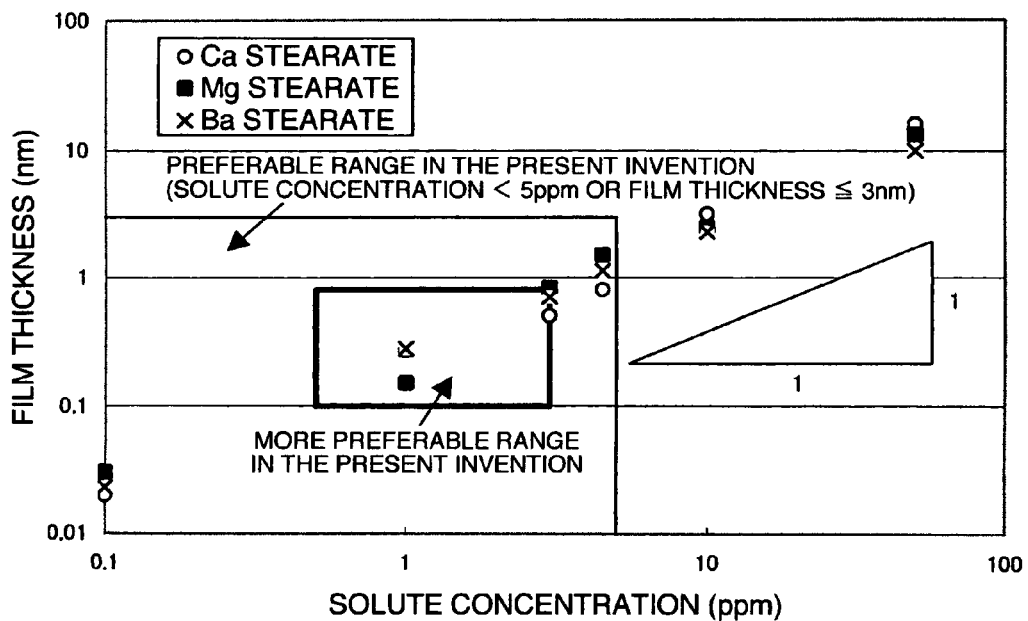
FIG.1
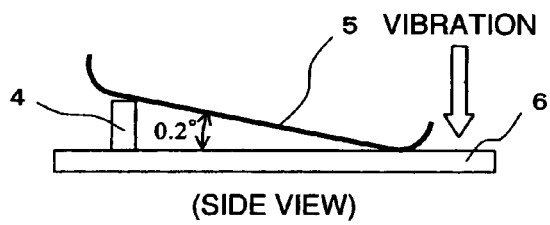
FIG.2
(SIDE VIEW)
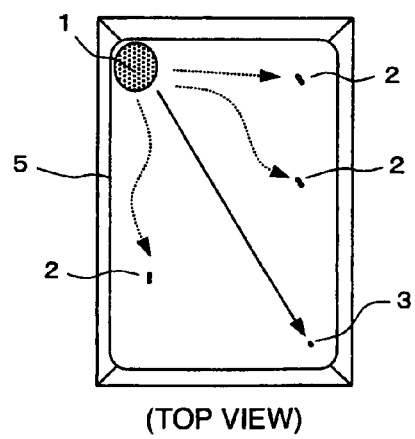
(TOP VIEW)

SOLDER BALL EXCELLENT IN MICRO-ADHESION PREVENTING PROPERTIES AND WETTING PROPERTIES AND METHOD FOR PREVENTING THE MICRO-ADHESION OF SOLDER BALLS

BACKGROUND OF THE INVENTION

The present invention relates to a solder ball that is excellent in micro-adhesion preventing properties and wetting properties and is used for, for example, the connection of electronic parts; and a method for preventing the micro-adhesion of solder balls.

At present, electronic parts obtained by mounting a semiconductor or the like on a substrate are produced by the use of a package having a form called BGA (ball grid array) or CSP (chip size package). In these electronic parts, solder balls are used for bonding of terminals. In general, the bonding of the terminals by the use of solder balls is often conducted in the case of bonding at intervals of hundreds microns and hence is required to have a high dimensional accuracy. In addition, if unsatisfactory soldering occurs in such bonding of the terminals, the package, which is very expensive as compared with the soldering cost, becomes defective. Therefore, the bonding is required to have a high reliability.

For attaining high dimensional accuracy and reliability in the bonding of the terminals, it is important to control the composition of solder balls, soldering conditions and the surface profile of the solder balls. As to the surface profile of the solder balls among them, the degree of oxidation of the surface has to be low. In producing the package by the use of solder balls, the solder balls are mounted at predetermined terminal positions on a BGA substrate and then melted with a heater to form bumps. In this case, if the surfaces of the solder balls are in an oxidized state, the wetting properties of the solder balls at the time of melting are deteriorated, so that the solder does not completely adhere to the terminals on the substrate, resulting in an insufficient bond strength. If a film of dirt, an organic substance or the like is formed on the surface of each solder ball, the wetting properties of the solder balls are deteriorated as in the case of an oxide film. The insufficient bond strength of the solder results in unsatisfactory soldering and hence a defective package.

The oxidation of the surfaces of the solder balls is called blackening because the oxidized surfaces of the solder balls look black. As to the problem of the decrease in bond strength of the solder caused by blackening, there are investigated various methods for suppressing the oxidation of the surfaces of the solder balls by coating the surfaces with a material different from a material for the solder balls. The employment of the following materials as the material for coating the solder balls is investigated: lubricants such as aliphatic hydrocarbon lubricants, higher aliphatic alcohol•higher fatty acid lubricants, fatty amide lubricants, metal soap lubricants, fatty ester lubricants, and the like (for example, JP-A-2000-288771 (patent document 1)); and rust preventives such as metals (e.g. Au and Sn) (for example, JP-A-08-164496 (patent document 2)).

The coating with any of the above-exemplified lubricants or Au suppresses the oxidation of the surfaces of the solder balls. Its concrete action is as follows. The lubricants have an effect of inhibiting the surfaces of the solder balls from becoming chemically active owing to wearing-away of the surfaces by their friction with the outside. In the case of the coating with Au, the oxidation of the surfaces of the solder balls is suppressed by coating the solder surfaces with Au that is not easily oxidizable.

On the other hand, in the case of the coating with Sn, the wetting properties of the solder balls at the time of melting are improved by coating the solder balls with the metal having high wetting properties at the time of melting for a material for the terminals, instead of suppressing the oxidation.

In recent years, as a cause for unsatisfactory bonding in the package, the problem of micro-adhesion of solder balls has been pointed out in addition to blackening. The micro-adhesion of solder balls is a phenomenon remarkably observed in the case of fine solder balls with a diameter of particularly 400 μm or less, more particularly 300 μm or less, and is a state in which originally separated solder balls are adhered to one another by a weak adhesive force. As described above, solder balls have to be mounted on a substrate so that each of them may be mounted at a predetermined terminal position. The mounting of the solder balls is conducted with an automated apparatus. In this case, if there are solder balls which have undergone micro-adhesion, they are not mounted at terminal positions at which they have to be mounted, or two or more of them are mounted at any of the terminal positions. As a result, unsatisfactory bonding is caused in the package.

The coating with any of the materials disclosed in the patent documents 1 and 2 reduces the deterioration of the wetting properties at the time of melting caused by blackening and improves unsatisfactory bonding in the package caused by this deterioration. These materials are excellent in this regard. However, as a result of investigation by the present inventors, it was found that the coating with any of the lubricants and the like cannot solve the problem of the micro-adhesion of solder balls and, moreover, increases the frequency of the micro-adhesion in some cases.

The present inventors closely investigated the problem of the micro-adhesion of solder balls obtained by solidification and spheroidization in a gas phase, and consequently found that the above-mentioned micro-adhesion is markedly affected by, in particular, a humidity to which the solder balls are exposed, and is not easily caused in a dry atmosphere having a low humidity. The present inventors confirmed that the various conventional coatings described above reduce friction but accelerate adhesion in some cases. In addition, it was found that the wetting properties are deteriorated with an increase of the thickness of a coating film formed by any of these coatings.

An object of the present invention is to solve the problem of the micro-adhesion of solder balls and provide a solder ball capable of being given good wetting properties and a method for preventing the micro-adhesion of solder balls.

SUMMARY OF THE INVENTION

The present inventors investigated a method for solving the problem of the micro-adhesion by the surface treatment of solder balls, and consequently found that the adsorption of metal soap molecules on the surfaces of the solder balls can reduce the occurrence of the micro-adhesion markedly. The present inventors also found that in addition to this reduction, more satisfactory wetting properties can also be attained by properly controlling the thickness of a film of the metal soap molecules adsorbed, whereby the present invention has been accomplished.

That is, the present invention provides a solder ball obtained by solidification and spheroidization in a gas phase and having metal soap molecules adsorbed on its surface, which is excellent in micro-adhesion preventing properties and wetting properties. The solder ball is provided as a solder ball possessing further improved wetting properties by forming the adsorbed metal soap molecules into a metal soap molecules film of 3 nm or less in thickness. As the metal soap, there can be used, for example, any of calcium stearate, magnesium stearate and barium stearate. The present invention is preferably applied to solder balls with a diameter of 400 μm or less.

In the method for preventing the micro-adhesion of solder balls of the present invention, solder balls obtained by solidification and spheroidization in a gas phase are immersed in a solution containing a metal soap dispersed therein, and then taken out of the solution, after which the solvent on the surfaces of the solder balls is vaporized and the surfaces are dried. In addition, more excellent wetting properties can be attained by adjusting the concentration of the metal soap dispersed in the solution to less than 5 ppm. The method for preventing the micro-adhesion of solder balls is preferably as follow: after the vaporization of the solvent on the surfaces of the above-mentioned solder balls, the surfaces are dried in an atmosphere having a relative humidity RH≦40%.

According to the present invention, the problem of the micro-adhesion of solder balls can be solved and, moreover, satisfactory wetting properties are retained. Therefore, unsatisfactory bonding in the production of a package such as BGA or CSP by the use of solder balls is reduced and, moreover, the wetting properties are retained or improved. As a result, the yield of the package can be improved. Thus, the present invention provides an industrially useful technique.

BRIEF DESCRIPTION OF DRAWINGS

FIG. 1 is a graph showing the relationship between the concentration of a metal soap dispersed in a solution for immersing solder balls and the thickness of a film of metal soap molecules adsorbed on the surface of each solder ball dried after the immersion.

FIG. 2 is a schematic view showing a method for measuring the frequency of occurrence of micro-adhesion, which was adopted in Examples.

DESCRIPTION OF REFERENCE NUMERALS

1. solder balls, 2. micro-adhered ball (solder ball), 3. single ball (solder ball), 4. block for height adjustment, 5. vat, 6. stand.

DETAILED DESCRIPTION OF THE INVENTION

As described above, the solder ball of the present invention is characterized by having metal soap molecules adsorbed on its surface, preferably a film with a predetermined thickness of metal soap molecules adsorbed on the surface. Though the special effect of the metal soap has not yet been sufficiently elucidated, it is conjectured as follows.

At first, the problem of the micro-adhesion of solder balls to one another is remarkably caused in the case of solder balls obtained by solidification and spheroidization in a gas phase, but it does not easily caused in the case of conventional commercial solder balls produced by a water-in-oil cooling process comprising solidification into balls in an oil, because of sufficient degreasing. Therefore, it is conjectured that this difference is due to a surface profile difference made by circumstances of the formation of the balls.

In practice, a solder ball obtained by solidification in a gas phase forms an oxide layer but this oxide layer has a depth of only about 2.5 nm in terms of sputtering rate of $SiO_2$. Therefore, it can be speculated that the surface is active and is very liable to adsorb water in the ambient air. When this speculation is combined with the fact that the micro-adhesion is accelerated by the increase of humidity of the ambient air, it is seriously conjectured that the adsorbed water accelerates the micro-adhesion of the solder balls to one another.

On the other hand, in coating the surface, the viscosity and adhesive properties of a coating material itself are problem. As a result of investigation by the present inventors, it has been confirmed that no satisfactory result can be obtained even when a fluororesin having a high water repellency is used. Therefore, the present inventors investigated the following: in order not to accelerate the adsorption of water, adhesion points are reduced by adsorbing molecules having no polar group, and as the molecules to be adsorbed, there are used molecules having such a structure that they are not easily entwined with one another, whereby the occurrence of adhesion caused by the adsorbed molecules is prevented. As a result, the present inventors chose a metal soap.

The metal soap is obtained as follows: a portion of the polar group of so-called soap, such as Na is replaced by Ba, Mg or the like, so that the portion of the polar group is lost, resulting in loss of the surface active properties. On the surface of a solder ball having as an adsorbed portion the metal atom portion of the metal soap having a strong interatomic force, the nonpolar organic acid portion of the metal soap is present. Therefore, the metal soap is effective in not only reducing adsorption points but also repelling water having a high polarity. Particularly when the organic acid portion of the metal soap is a simple straight-chain carboxylic acid such as stearic acid, the adhesion, reaction or entwinement of metal soap molecules with one another is not easily caused. Therefore, such a metal soap is the most suitable.

The frequency of occurrence of the micro-adhesion of solder balls increases with a decrease of the diameter of the solder balls. The reason is conjectured as follows. In the case of solder balls with a large diameter, even when they undergo micro-adhesion, they are easily re-separated because the load applied to the adhered portion is increased by the weight of the solder balls themselves. On the other hand, in the case of solder balls with a small diameter, when they undergo micro-adhesion, they are not easily re-separated because the load applied to the adhered portion is light. In addition, it can be speculated that solder balls with a smaller diameter are more liable to undergo micro-adhesion because their curvature is larger, so that the surface energy is increased, resulting in an enhanced affinity for water vapor in air. Particularly in the case of solder balls with a diameter of 400 μm or less, more particularly 300 μm or less, the occurrence of their micro-adhesion increases but it can be greatly reduced by coating the surfaces of the solder balls with a metal soap and drying the surfaces.

In recent small package forms such as CSP, further reduction of the pitch of terminals is in progress. The wetting properties of solder balls are important, for example, in the formation of bumps as described above. With the above-mentioned reduction of the pitch, good wetting properties at a smaller amount of a flux used are required in mounting of solder balls on a substrate. At such a slight amount of a flux used, the solder balls come off remarkably when the wetting properties of the solder balls are not good. Therefore, the solder balls are desired to have so excellent wetting properties that they can be used even when the amount of a flux used is very small.

Accordingly, the present inventors evaluated wetting properties that are required of solder balls. As described above, the solder balls of the present invention solve the problem of their mutual micro-adhesion by having a film of metal soap molecules adsorbed on the surface of each solder ball. On the other hand, it was found that when the film of metal soap molecules is too thick, the wetting properties of the solder balls are deteriorated. It was also found that as the thickness of the film of metal soap molecules, there is a coating thickness that makes it possible to solve the problem of the micro-adhesion satisfactorily and is most suitable for the retention and improvement of good wetting properties. That is, the solder ball of the present invention preferably has a film of 3 nm or less in thickness of metal soap molecules adsorbed on its surface.

Here, the above-mentioned coating thickness of the metal soap is defined as follows. The film of metal soap molecules according to the present invention as a coating film on the surface of the solder ball exhibits the above-mentioned additional effect when its thickness is maintained at the predetermined thickness. It is not easy to measure the coating thickness of the metal soap molecules film itself at which the additional effect is exhibited. Therefore, in the present invention, a method for accurate specification and description was investigated in order to reproduce the thickness of the metal soap molecules film at which the additional effect is exhibited. As a result, there was adopted a method in which by analyzing the C (carbon) content of the surface of a solder ball in the direction of surface depth by a combination of Auger electron spectroscopy (AES) and surface sputtering, the C content is correlated with the coating thickness of the metal soap molecules film and can be converted to the coating thickness.

The coating thickness of the metal soap molecules film according to the present invention has a substantially linear correlation with the amount of C detected which represents the metal soap concentration of a solution for coating treatment described hereinafter. On the other hand, the rate of perforation by sputtering on the surface of a solder ball can be estimated in terms of $SiO_2$. For attaining a higher accuracy, the actual depth of perforation has to be estimated in terms of the rate of perforation of, for example, Sn which constitutes the substance of the solder ball. However, in the present invention, since there is no standard capable of permitting calibration (since the preparation of a standard sample is difficult), $SiO_2$ is employed as a standard sample and the film thickness of the metal soap is defined as a depth converted from the rate of perforation of $SiO_2$. When such a method for describing the coating thickness of the metal soap is adopted, the upper limit of a coating thickness capable of imparting both micro-adhesion preventing properties and more satisfactory wetting properties according to the present invention is 3 nm. The coating thickness is preferably 0.1 to 1.5 nm, more preferably 0.1 to 0.8 nm.

The solder ball of the present invention can be obtained, for example, by immersing a solder ball formed by solidification and spheroidization in a gas phase, in a solution containing a metal soap dispersed therein, taking out the solder ball from the solution, vaporizing a solvent on the surface of the solder ball, and then drying the surface. For further improving the wetting properties, the thickness of metal soap molecules covering the solder ball surface after the immersion and drying is preferably small (the amount of metal soap molecules adsorbed is preferably small). That is, the upper limit of the concentration of the metal soap in the solution is controlled so as to be preferably 25 ppm or less, more preferably less than 10 ppm. For adjusting the coating thickness of metal soap molecules to 3 nm (the aforesaid upper limit) or less, the concentration of the metal soap dispersed in the solution is preferably adjusted to less than 5 ppm.

The concentration of the metal soap dispersed in the above-mentioned solution is preferably 0.5 ppm or more, more preferably 1 ppm or more, from the viewpoint of the preventive effect of the immersion on the micro-adhesion. However, when the concentration is as too high as about 1,000 ppm, the micro-adhesion is accelerated. On the other hand, when importance is attached to more excellent wetting properties, the concentration is preferably 3 ppm or less. As the solvent used for dispersing the metal soap, there can be used, for example, alcohol solvents, HFE (hydrofluoro ether) solvents such as Novek series solvents manufactured by SUMITOMO 3M LTD., and solvents comprising a fluoride such as $C_nF_{2(n+1)}$.

After the vaporization of the solvent, the surface of the solder ball is preferably further dried in an atmosphere having a relative humidity RH≦40%. This drying is conducted for removing, as much as possible, water molecules adsorbed owing to the solvent or the ambient air during handling, by employing the atmosphere having a low relative humidity. The drying is preferably conducted in an atmosphere having a relative humidity RH≦20%. The drying is preferably conducted for 1 hour or more.

EXAMPLE 1

Under the conditions described below, metal soap molecules were adsorbed on the surfaces of solder balls of Φ350 μm and solder balls of Φ300 μm composed of 3 mass % of Ag, 0.5 mass % of Cu and the balance of Sn and obtained by solidification in a gas phase, and the surfaces were dried, after which the frequency of occurrence of micro-adhesion was estimated.

Treating agents:
  barium stearate (present invention example 1),
  magnesium stearate (present invention example 2),
  calcium stearate (present invention example 3)
Solvent: $C_5F_{12}$ fluoride type solvent
Concentration: 500 ppm
Method: immersion for 300 seconds, followed by vaporization of the solvent at 40° C. for 600 seconds (thermostatic chamber)
Drying conditions:
  atmosphere: relative humidity RH=10%, room temperature RT=24° C.
  drying (standing) time: 10 hours.

The frequency of occurrence of micro-adhesion was estimated by a method in which as schematically shown in FIG. 2, a vat 5 was tilted at an angle of 0.2° to the horizontal plane with a block for height adjustment 4 and a stand 6 was vibrated to roll solder balls 1 on the plane of the vat 5. As shown in FIG. 2, when the solder balls 1 were rolled on the vat 5, a solder ball that had not undergone micro-adhesion (the single ball 3 in FIG. 2) went straight downward, while most of solder balls that had undergone micro-adhesion (the micro-adhered balls 2 in FIG. 2) did not go straight. The number (the number of groups) of micro-adhered balls among about 1,900 solder balls was counted by a method comprising visually confirming the micro-adhered balls 2 that did not go straight downward.

For comparison, the same estimation as above was carried out also for solder balls not treated at all (comparative example 1) and solder balls coated with sodium stearate (comparative example 2). The coating with sodium stearate was conducted under the following conditions:

Coating conditions for (comparative example 2)
  Treating agent : sodium stearate
  Solvent : isopropyl alcohol
  Concentration : 500 ppm
  Method : immersion for 600 seconds, followed by vaporization
    of the solvent at 50° C. for 600 seconds (thermostatic chamber)
  Drying conditions: the same as for the present invention examples 1 to 3.

TABLE 1

|  | Present invention example 1 | | Present invention example 2 | | Present invention example 3 | |
| --- | --- | --- | --- | --- | --- | --- |
|  | φ350 | φ300 | φ350 | φ300 | φ350 | φ300 |
| Treating agent | Ba stearate | | Mg stearate | | Ca stearate | |
| Number of groups of micro-adsorbed solder balls (groups) | 0 | 6 | 0 | 0 | 0 | 2 |
| Frequency of occurrence (%) | 0.00 | 0.32 | 0.00 | 0.00 | 0.00 | 0.01 |

TABLE 2

|  | Comparative example 1 | | Comparative example 2 | |
| --- | --- | --- | --- | --- |
|  | φ350 | φ300 | φ350 | φ300 |
| Treating agent | None (no treatment) | | Na stearate | |
| Number of groups of micro-adsorbed solder balls (groups) | 41 | 52 | 18 | 27 |
| Frequency of occurrence (%) | 2.15 | 2.73 | 0.95 | 1.42 |

As can be seen from the results shown in Table 1 and Table 2, the occurrence of micro-adhesion is greatly reduced in the case of both the solder balls of Φ350 μm and solder balls of Φ300 μm of the present invention examples, which had metal soap molecules adsorbed thereon, as compared with the untreated solder balls of comparative example 1. On the other hand, the frequency of occurrence of micro-adhesion is reduced in the case of the solder balls coated with so-called soap of comparative example 2 as compared with the untreated solder balls of comparative example 1, but the reduction is not sufficient.

EXAMPLE 2

Metal soap molecules were adsorbed on the surfaces of solder balls of Φ300 μm composed of 3 mass % of Ag, 0.5 mass % of Cu and the balance of Sn and obtained by solidification in a gas phase, by immersing the solder balls in each of solutions containing various concentrations of the metal soap, and the surfaces were dried. Magnesium stearate was used as the metal soap and the treating and drying conditions other than the concentrations of the metal soap in the solutions were the same as in the case of the present invention examples 1 to 3. Mounting of the thus treated solder balls on a substrate and their reflow were tested under the conditions described below, to estimate their wetting properties at the concentrations of the metal soap in the solutions.

As to the mounting conditions and reflow conditions, a water-soluble flux was applied by pin transfer on a substrate having a plated Ni/Au film formed on one side, as a very small amount of a flux for an assumed narrow pitch, and the solder balls were mounted thereon. The reflow was carried out at 220° C. or higher (the highest: 240° C.) for 60 seconds and the spread-of-wetting ratio $[=\sqrt{}$ (spread-of-wetting area/the projected area of the ball)] in this case was measured. The higher the spread-of-wetting ratio, the higher the wetting properties.

TABLE 3

|  | Mg stearate concentration | | | | |
| --- | --- | --- | --- | --- | --- |
|  | 5 ppm | 8 ppm | 25 ppm | 150 ppm | 500 ppm |
| Spread-of-wetting ratio | 4.1 | 3.9 | 2.8 | 2.1 | 1.8 |

It can be seen that the micro-adhesion of the solder balls having metal soap molecules adsorbed thereon can be markedly suppressed and that as shown in Table 3, these solder balls also have excellent wetting properties when the metal soap concentration in the immersion for the adsorption is adjusted to the optimum concentration.

EXAMPLE 3

Under the conditions described below, metal soap molecules were adsorbed on the surfaces of solder balls of Φ300 μm composed of 3 mass % of Ag, 0.5 mass % of Cu and the balance of Sn and obtained by solidification in a gas phase, and the surfaces were dried. Then, the frequency of occurrence of micro-adhesion was estimated.

Treating agents:
  barium stearate (present invention example 4),
  magnesium stearate (present invention example 5),
  calcium stearate (present invention example 6)
Solvent: $C_5F_{12}$ fluoride type solvent
Concentrations: six concentrations of 0, 1.0, 3.0, 4.5, 10 and 50 ppm
Treating conditions: immersion for 180 seconds, followed by drying by vaporization of the solvent at a relative humidity RH of 10% and at room temperature RT of 22° C.

At first, there was measured the thickness of a film of metal soap molecules adsorbed on the surface of each of the solder balls treated at each of the aforesaid six concentrations, after the aforesaid drying by vaporization. The measurement was carried out by the above-mentioned method comprising analysis of the C content in the direction of surface depth by a combination of AES and sputtering. The results obtained are shown in FIG. 1, a log-log graph.

From FIG. 1, it can be seen that in the case of all the metal soaps, there is a linear correlation between the concentration of each metal soap as solute and the thickness of the adsorption film after the immersion and drying and that the thickness of the adsorption film can be controlled by adjusting the concentration of the metal soap in a solution for the immersion.

Then, the frequency of occurrence of micro-adhesion was estimated. The estimation was carried out in the same manner as that described in Example 1 and shown in FIG. 2, namely, the estimation was carried out by counting the number (the number of groups) of micro-adhered balls among about 100,000 solder balls. The experimental results are shown in Table 4.

TABLE 4

| Number of micro-adsorbed solder balls | Solute concentration (ppm) | | | | | |
|---|---|---|---|---|---|---|
| (balls) | 0 | 1.0 | 3.0 | 4.5 | 10 | 50 |
| Ca stearate | 30 [—] | 9 [0.27] | 7 [0.5] | 7 [0.8] | 5 [3.2] | 4 [16] |
| Mg stearate | ↑ [—] | 7 [0.15] | 4 [0.83] | 2 [1.5] | 2 [2.5] | 1 [13.2] |
| Ba stearate | ↑ [—] | 6 [0.28] | 4 [0.7] | 3 [1.13] | 2 [2.3] | 1 [10] |

Each value in [ ] after the number of micro-adhered solder balls is a coating thickness value (nm) measured by employment of AES.

In addition, the wetting properties were evaluated by mounting the solder balls on pads coated with a very small amount of a flux on a BGA substrate, subjecting them to reflow treatment under a nitrogen atmosphere, and observing the degree of wetting by the balls. The evaluation conditions are as follows:

Pad; diameter: 240 µm, ground: an electroless plated Ni film, surface: a flash-plated Au film, the number of pads: 100
Flux; a water-soluble flux WS-9160-M3 (mfd. by Alpha Metals Co., Ltd.), applied in an amount of 0.0004 mm$^3$ with a dispenser
Reflow conditions; N$_2$ atmosphere, preheating;
  150–170° C./180 seconds +220° C. or
  higher/60 seconds (peak temperature: 240° C.).

As to the judgment of the wetting properties, the pads after the reflow were classified into following three groups: pads the whole surface of which was wetted and which showed a satisfactory bump shape; pads partly wetted and showing a distorted bump shape; and pads not wetted at all. Then, the percentage of bumps having a satisfactory shape was calculated. The experimental results are shown in Table 5.

TABLE 5

| Percentage of satisfactory bumps (%) | Solute concentration (ppm) | | | | | |
|---|---|---|---|---|---|---|
| | 0 | 1.0 | 3.0 | 4.5 | 10 | 50 |
| Ca stearate | 100 [—] | 100 [0.27] | 100 [0.5] | 95 [0.8] | 90 [3.2] | 70 [16] |
| Mg stearate | ↑ [—] | 100 [0.15] | 100 [0.83] | 100 [1.5] | 91 [2.5] | 75 [13.2] |
| Ba stearate | ↑ [—] | 100 [0.28] | 100 [0.7] | 100 [1.13] | 93 [2.3] | 80 [10] |

Each value in [ ] after the percentage of satisfactory bumps is a coating thickness value (nm) measured by employment of AES.

From Table 4, it can be seen that in spite of the kind of the metal soap used, the occurrence of micro-adhesion can be greatly reduced in the case of solder balls of Φ300 µm having a large coating thickness or treated by the immersion at a high solute concentration, as compared with solder balls of Φ300 µm subjected to no coating treatment, namely, those corresponding to a solute concentration of 0 ppm. For reducing the number of micro-adhered solder balls, the solute concentration is preferably as high as possible, though the effect of the increase of the solute concentration substantially reaches a point of saturation at 10 ppm.

On the other hand, it can be seen from FIG. 5 that with a decrease of the coating thickness or a decrease of the solute concentration employed in the immersion, the wetting properties and the bump shape are improved. When the solute concentration is 3 ppm or less, good wetting properties can be attained which are equal to wetting properties attained without the coating treatment. The suitable upper limit of the solute concentration is 3 ppm. The coating thickness is suitably 0.8 nm or less.

It can be seen that solder balls satisfying the desirable requirements of the present invention with respect to the coating thickness of metal soap molecules or the solute concentration employed in the immersion have both good micro-adhesion preventing properties and good wetting properties. For attaining both of them, the suitable range of the solute concentration is 0.5 to 3 ppm and that of the coating thickness is 0.1 to 0.8 nm.

The invention claimed is:

1. A process for producing a solder ball which is excellent in micro-adhesion preventing properties and wetting properties, wherein metal soap molecules are adsorbed on the surface of a solder ball obtained by solidification and spheroidization in a gas phase.

2. A process for producing a solder ball which is excellent in micro-adhesion preventing properties and wetting properties according to claim 1, wherein a metal soap molecule film of 3 nm or less in thickness is adsorbed on the surface of the solder ball.

3. A process for producing a solder ball which is excellent in micro-adhesion preventing properties and wetting properties according to claim 1, wherein the metal soap is selected from any of calcium stearate, magnesium stearate or barium stearate.

4. A process for producing a solder ball which is excellent in micro-adhesion preventing properties and wetting properties according to claim 1, wherein the diameter of the solder ball is made 400 µm or less.

5. A process for producing a solder ball which is excellent in micro-adhesion preventing properties and wetting properties according to claim 2, wherein the metal soap is selected from any of calcium stearate, magnesium stearate or barium stearate.

* * * * *